United States Patent
Schmidt et al.

(12)

(10) Patent No.: US 6,293,008 B1
(45) Date of Patent: Sep. 25, 2001

(54) METHOD FOR PRODUCING FOIL CIRCUIT BOARDS

(75) Inventors: Walter Schmidt, Zürich; Marco Martinelli, Neftenbach, both of (CH)

(73) Assignee: Dyconex Pantente AG, Zug (CH)

( * ) Notice: Subject to any disclaimer, the term of this patent is extended or adjusted under 35 U.S.C. 154(b) by 0 days.

(21) Appl. No.: 09/591,821

(22) Filed: Jun. 12, 2000

Related U.S. Application Data

(62) Division of application No. 08/556,921, filed as application No. PCT/CH94/00062 on Mar. 23, 1994, now Pat. No. 6,162,996.

(51) Int. Cl.[7] .................................................... H01K 3/22
(52) U.S. Cl. ................... 29/848; 29/830; 29/846; 174/254; 174/259; 156/268; 216/17; 216/20
(58) Field of Search ............................ 29/830, 846, 848; 174/254–255, 259; 361/749, 792–795, 750; 216/57–58, 63, 67; 156/322, 268, 275.5, 275.7

(56) References Cited

U.S. PATENT DOCUMENTS

| | | |
|---|---|---|
| 3,589,004 | 6/1971 | Shaheen . |
| 4,931,134 | 6/1990 | Hatkevitz et al. . |
| 5,004,639 | 4/1991 | Desai . |
| 5,095,628 * | 3/1992 | McKenney et al. .................... 29/846 |
| 5,142,448 * | 8/1992 | Kober et al. ....................... 29/846 X |
| 5,144,534 * | 9/1992 | Kober ................................ 29/746 X |
| 5,144,742 * | 9/1992 | Lucas et al. ............................ 29/830 |
| 5,262,594 * | 11/1993 | Edwin et al. ....................... 29/846 X |
| 5,288,542 | 2/1994 | Cibulsky . |
| 5,347,712 | 9/1994 | Yasuda et al. . |
| 5,499,444 | 3/1996 | Doane, Jr. et al. . |
| 5,638,597 * | 6/1997 | Cuttings et al. ........................ 29/830 |
| 5,655,291 * | 8/1997 | Todd et al. ............................. 29/830 |

FOREIGN PATENT DOCUMENTS

| | | |
|---|---|---|
| 3302857 A1 | 8/1984 | (DE) . |
| 4249026 | 3/1993 | (DE) . |
| 534290 | 3/1993 | (EP) . |
| 575292 | 12/1993 | (EP) . |
| 0025225 * | 8/1979 | (JP) ....................................... 29/846 |
| WO 93/26143 | of 0000 | (WO) . |

\* cited by examiner

Primary Examiner—Lee Young
Assistant Examiner—Rick Kiltae Chang
(74) Attorney, Agent, or Firm—Rankin, Hill, Porter & Clark LLP

(57) ABSTRACT

A method for producing a foil circuit board including a plurality of flexible electrically non-conductive and flexible conductive layers, which are laminated together. The non-conductive layers are positioned between the conductive layers and two of the conductive layers are the outermost surface layers of the foil circuit board. The circuit board includes flexible areas and rigid areas, and the flexible areas are provided by etching the board to remove at least part of one of the outermost surface layers and an adjacent underlying non-conductive layer.

3 Claims, 4 Drawing Sheets s    f    s

METHOD FOR PRODUCING FOIL CIRCUIT BOARDS

CROSS-REFERENCE TO RELATED APPLICATIONS

The present application is a division of U.S. patent application Ser. No. 08/556,921 filed Nov. 21, 1995, now U.S. Pat. No. 6,162,996, which is a 371 of PCT/CH94/00062, filed Mar. 23, 1994.

BACKGROUND OF THE INVENTION

1. Field of the Invention

The invention is in the field of printed circuit boards and relates to a method for producing a foil circuit board.

2. Description of Related Art

According to a foil technology such as is described in the international patent application with the publication number WO 93/26143 of the same applicants, thin circuit boards are produced from foils or films of an electrically insulating material (e.g. polyimide or epoxy resin) coated on one or both sides with e.g. copper. The production of these foil circuit boards essentially comprises producing conductors and plated through holes on a foil coated on both sides using known photographic and chemical/physical methods. A circuit board obtained in this way with an insulating foil layer and two conductor layers can be laminated on one or both sides with a further insulating foil (coated on one side with metal) with the aid of, in each case, an adhesive coating. The further insulating foil or foils are then once again provided with conductors and plated through-holes. These method steps can be repeated any number of times, so that foil circuit boards are obtained comprising a plurality of insulating foil layers and a plurality of conductor layers.

As such, insulating foil circuit boards are very thin and, particularly if they only comprise a few foil layers are also flexible. Prior to assembly the boards are normally laminated onto a rigid substrate, which leads to circuit boards that correspond, as regards thickness and format, to the normal standards.

If foil circuit boards are built up from several insulating foil layers, their flexibility very significantly decreases. In this way, even without a substrate, very thin circuit boards can be produced that have an adequate natural rigidity as compared with standard circuit boards for assembly purposes. Such circuit boards are e.g. used for multichip modules.

Electronic components and circuit boards assembled therewith are becoming increasingly smaller. Also, equipment and apparatus in which such circuit boards are installed are increasingly smaller in size as well. It would be advantageous in many cases if the circuit boards could be housed in the equipment in such a way as to save more space, i.e. if they could be adapted in an optimum manner, particularly in a flexible or bendable manner with respect to the equipment shape or at least the shape of the equipment inner space allocated thereto. However, it is still necessary for the assembly of circuit boards to prevent, by adequate rigidity of the circuit board, stresses in the connections between the electronic components and conductors on the circuit board which can be caused by circuit board deformations.

SUMMARY OF THE INVENTION

An object of the invention is to provide insulating foil circuit boards that satisfy both of the aforementioned conditions. Namely, the foil circuit boards according to the invention are flexible and bendable to enable adaptation thereof to the environment, while being rigid enough to facilitate assembly thereof.

The central idea of the invention is based on the fact that insulating foil circuit boards are zonally flexible and zonally rigid. In the flexible areas, compared with the rigid areas, one or more outer insulating foil layers are interrupted or have a reduced thickness such that a flexible area is, overall, thinner than a rigid area. Production of insulating foil circuit boards according to the invention includes an etching step, preferably a plasma etching stage, wherein at least one of the outermost insulating foil layers of the circuit board is removed in a larger surface manner at locations corresponding to desired flexible areas. This etching stage can be performed on the last laminated-on insulating foil layer or layers or can be repeated for further laminated-on insulating foil layers. The method is particularly advantageous if, in the same etching stage, the openings necessary for the plated through-holes are produced in the corresponding insulating foil layer.

This leads to insulating foil circuit boards having rigid and flexible areas. Through a corresponding design of the transition between the rigid and flexible areas this can be made quasi-continuous, which prevents an area made flexible for bending purposes from breaking at the transition to the rigid area. The thickness difference or the difference in the number of insulating foil layers between rigid and flexible areas is of a random nature and will be adapted as a function of the complexity of the electronic circuit (number of insulating foil layers in the rigid area) and the desired flexibility (number of insulating foil layers in the flexible area). The flexible area has at least one insulating foil layer and the rigid area at least two. For increasing their natural rigidity, the rigid areas can also be drawn onto a rigid substrate.

The layout of the printed circuit board according to the invention is obviously such that the rigid areas are assembled, whereas there are only interconnecting conductors in the flexible areas.

As has already been mentioned, insulating foil circuit boards with rigid and flexible areas can be used where there are difficult space conditions. However, it is also possible to equip, e.g., multichip modules with flexible marginal areas, which can then be used for connection to a rigid circuit board.

BRIEF DESCRIPTION OF THE DRAWINGS

These and further features of the present invention will be apparent with reference to the following description and drawings, wherein.

DETAILED DESCRIPTION OF THE PREFERRED EMBODIMENTS

Figure 1:
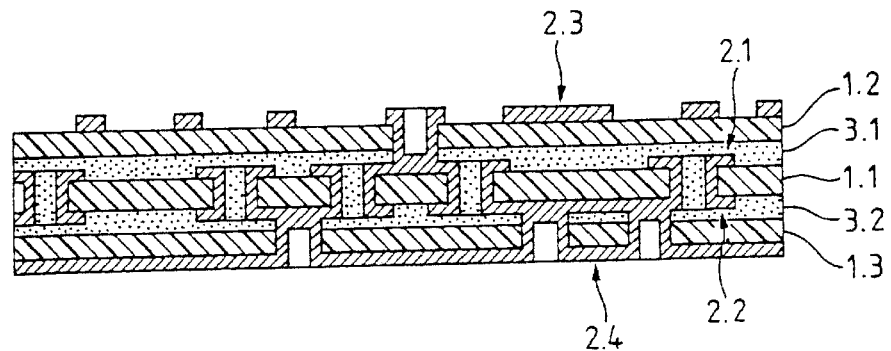
FIG. 1 is a sectional side elevational view of a foil circuit board with three insulating foil layers and four conductor layers produced according to the present method.

FIG. 1 shows a cross-section through an area of a foil circuit board. The board and the production thereof is described in the aforementioned international publication (WO 93/26143). The circuit board comprises a central film or insulating foil layer (plastic film) 1.1, plated-through holes, and a two-sided pattern of conductors 2.1 and 2.2. On both sides, by means of adhesive coatings 3.1 and 3.2, a further non-conductive foil layer 1.2 and 1.3 is, in each case, laminated onto the central foil layer 1.1. The further insulating foil layers 1.2, 1.3, once again, have plated-through holes and a pattern of conductors 2.3 and 2.4. These outer plated-through holes are produced in the laminated-on insulating foil coated with a thin metal coating, in that with photochemical means the metal coating is etched away at the corresponding points and then the plastic film is etched through by plasma etching. The metallic coating is then, e.g., built up by electroplating to a thickness suitable for the conductors and the openings are simultaneously plated through. The pattern of the conductors is etched photochemically into the metal coating produced in this way.

Figure 2A:
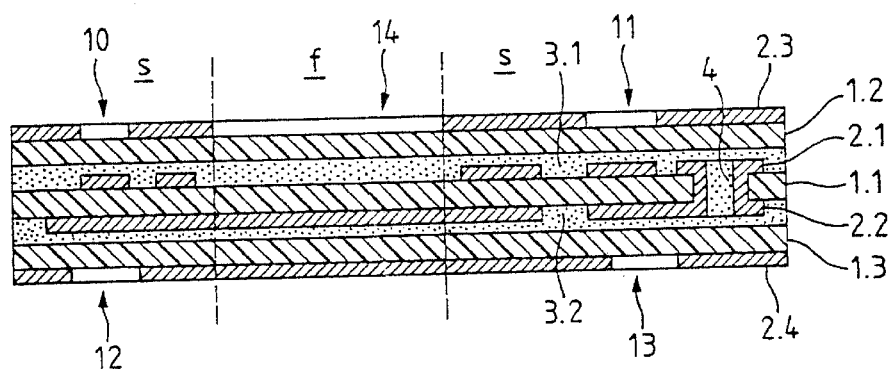
FIGS. 2a to 2c are sectional side elevational views of three stages in the production of a first embodiment of the foil circuit board according to the invention, the rigid areas having three insulating foil layers and the flexible area having two insulating foil layers.
Figure 2B:
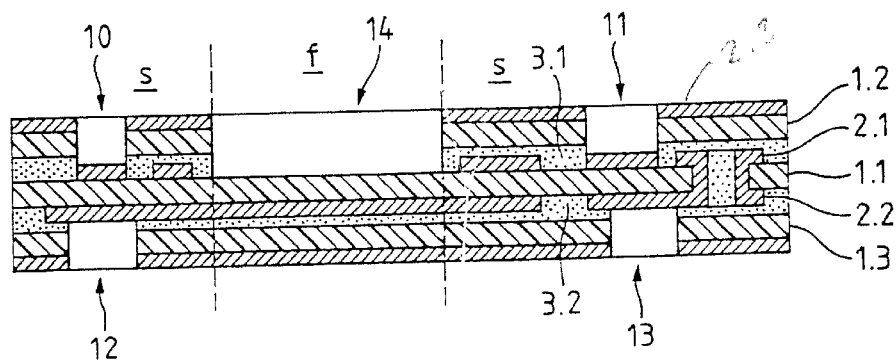
Figure 2C:
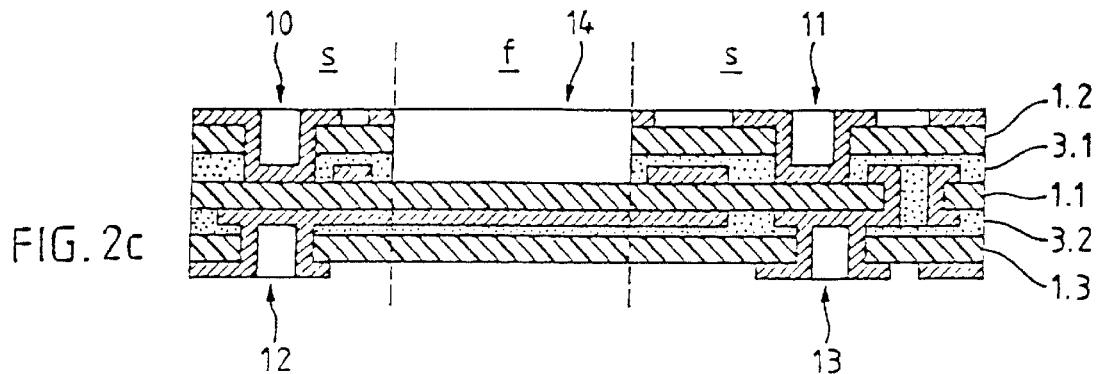

FIGS. 2a to 2c illustrate a cross-section through an area of an embodiment of the circuit board according to the invention in the three stages of its production. As in FIG. 1, the board is a foil circuit board with three non-conductive foil layers 1.1, 1.2, 1.3 and four conductor layers, 2.1, 2.2, 2.3, 2.4, on which a flexible area f is provided between two rigid areas s.

FIG. 2a shows the foil circuit board after laminating the outer insulating foil layers 1.2 and 1.3 with adhesive coatings 3.1 and 3.2 on the central foil layer 1.1, provided in the preceding method steps with a two-sided conductor pattern 2.1, 2.2 and with plated through-holes 4. The metal coatings 2.3, 2.4 of the outer insulating foil layers 1.2, 1.3 are already etched away at points 10, 11, 12 and 13 for plated-through holes and in the central area at point 14 of the flexible area f provided.

FIG. 2b shows the circuit board of FIG. 2a following a plasma etching stage in which the points 10 to 14 of the plastic film not covered with metal have been removed. Thus, at points 10 to 13, blind holes have been obtained up to the conductors of the conductor layers 2.1, 2.2. At point 14, where there is a larger-surface opening in the insulating foil layer 1.2, the adhesive coating 3.1 also having been removed.

The etching parameters for the plasma etching of the described stage must be set in such a way that the blind holes are etched sufficiently deep, but without any undesired undercutting. In the same etching stage, i.e. with the same etching parameters, in the flexible area f the plastic film 1.2 and the adhesive coating 3.1 are etched away. Thus, the requirements with regards to etching at points 10 to 13 are not precisely the same as the requirements regarding etching at the point 14. However, etching in one stage is still possible if, for example, use is made of polyimide films and polyimide adhesive coatings, the adhesive coating being either uncured or not completely cured prior to plasma etching. As a result, the adhesive coating offers a considerably reduced resistance to the etching and is very rapidly etched away, so that the deeper etching process at point 14 does not lead to an undesired undercutting at points 10 to 13. However, it can also be acceptable, as a function of the particular use, if adhesive coating residues are left behind at point 14.

FIG. 2c shows the same finished circuit board area after the plating through of the blind holes at points 10 to 13 and the photochemical production of the conductor pattern on the two surfaces of the circuit board. As can be gathered from the drawing, in its rigid areas s the finished circuit has three (1.1, 1.2, 1.3) insulating foil layers (four conductor layers) and in its flexible area two (1.1, 1.3) insulating foil layers (e.g. one conductor layer).

FIGS. 3a to 3d show a further method for the production of foil circuit boards according to the invention wherein the flexible areas can be produced with a continuous transition to the rigid areas. The method differs from that described in conjunction with FIGS. 2a to 2c in that the etching stage for producing the flexible areas is not the same as the etching stage for producing the blind holes. This obviates the need for the same etching parameters, which leads to much greater freedom, but the method is more complicated.

Figure 3A:
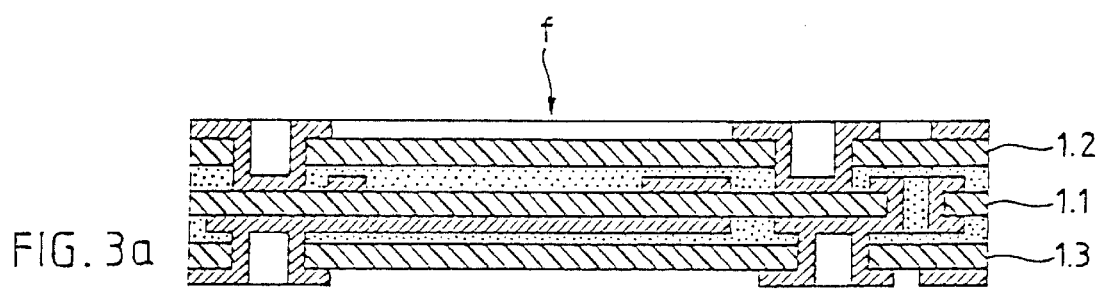
FIGS. 3a to 3d are sectional side elevational views of four stages in the production of a second exemplified embodiment of the foil circuit board according to the invention, the rigid areas having three insulating foil layers and the flexible area having two insulating foil layers, and there is a continuous transition between the rigid and flexible areas.
Figure 3B:
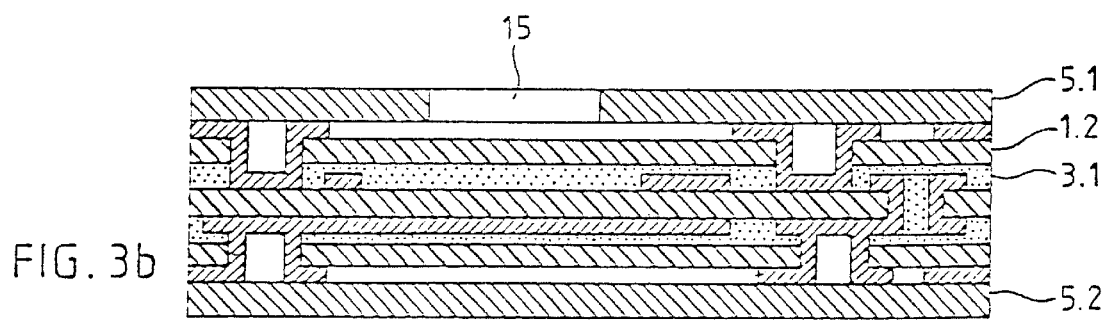

FIG. 3a shows an insulating foil circuit board with three foil layers 1.1, 1.2 and 1.3 (four circuit board layers), whose conductor pattern on the two surfaces with the blind holes to the lower lying conductors is already produced. In the central area to be transformed into a flexible area f, the circuit board only has internal conductors. As shown in FIG. 3b, onto both sides of this foil circuit board is pressed a metal mask 5.1 and 5.2 (e.g. of high-grade steel), which in the flexible area f e.g. has recesses 15 on one side.

Figure 3C:
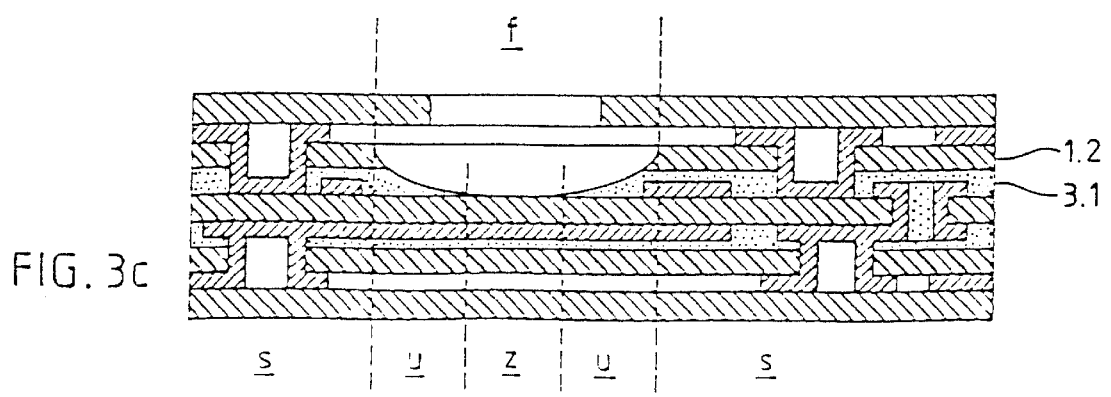

If the circuit board provided with the pressed-on mask now undergoes a further plasma etching stage whereby the circuit board according to FIG. 3c is obtained in which, in the flexible area f, the plastic film accessible through the metal mask has been attacked. As a function of the chosen etching parameters and the spacing between the mask and the substrate, it is possible to obtain undercuttings, as shown in FIG. 3c, so that from marginal areas u of the flexible area f, where the removal is less, the thickness of the insulating foil layer 2.1 and adhesive coating 3.1 successively decreases towards a central area z.

Figure 3D:
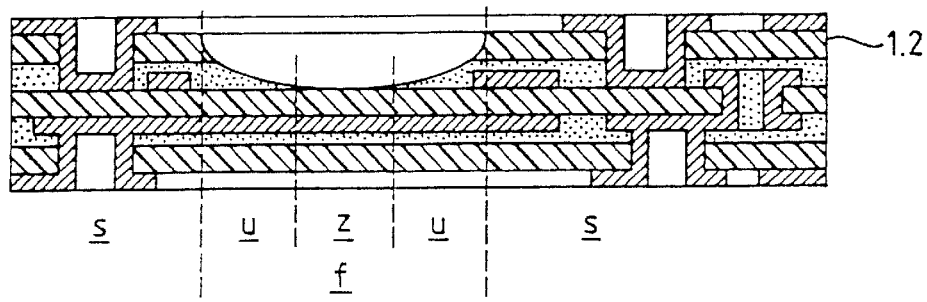

FIG. 3d shows the finished foil circuit board with the continuous transition between the flexible area f and the rigid areas s. It is conceivable to laminate further insulating foil layers onto the circuit board and they are once again etched away in the flexible areas f, e.g. according to the method described in conjunction with FIGS. 2a to 2c.

Figure 4:
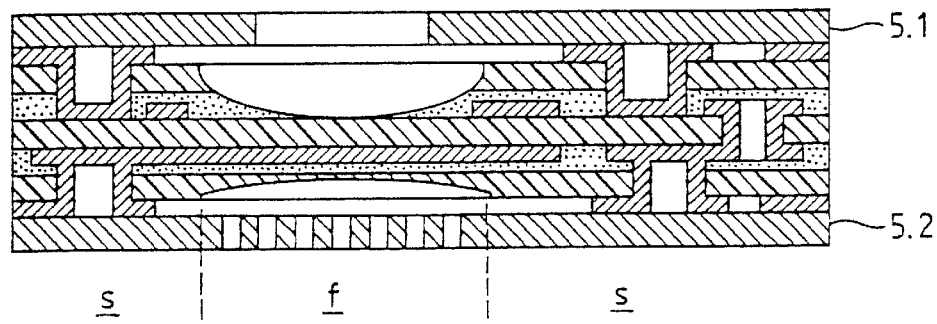
FIG. 4 is a sectional side elevational view of a further embodiment of the insulating foil circuit board according to the invention with a continuous area transition.

FIG. 4 shows another exemplified embodiment of the foil circuit board according to the invention. The production stage is the same as shown in FIG. 3c. Onto both sides of the circuit board, which is already complete with the exception of the flexible areas f, are pressed metal masks 5.1 and 5.2 with openings corresponding to the desired flexible areas. The circuit board is then subjected to a plasma etching stage. The removal of the insulating foil material by the etching stage is, as stated, dependent on the etching parameters and shapes and arrangements of the openings in the mask. This can be clearly gathered from a comparison of the removal or etching away at the top and bottom in FIG. 4. Removal of the insulating foil material at the top, like shown and described hereinbefore with reference to FIG. 3c, occurs through a single mask opening. At the bottom, to reduce removal, there is a series of smaller openings instead of a single opening in the mask. Therefore, the etching rate can be reduced for constant etching parameters. A reduced etching rate is advantageous on the underside, because with higher etching rates the conductors would be exposed, which is not necessarily desired in the flexible area.

FIGS. 5a to 5d illustrate a method with which similar flexible areas can be produced to those of the method according to FIGS. 3 and 4, but in which no special etching stage is required for the flexible areas f, i.e. where the flexible areas with the blind holes are produced with the etching parameters resulting from the latter.

Figure 5A:
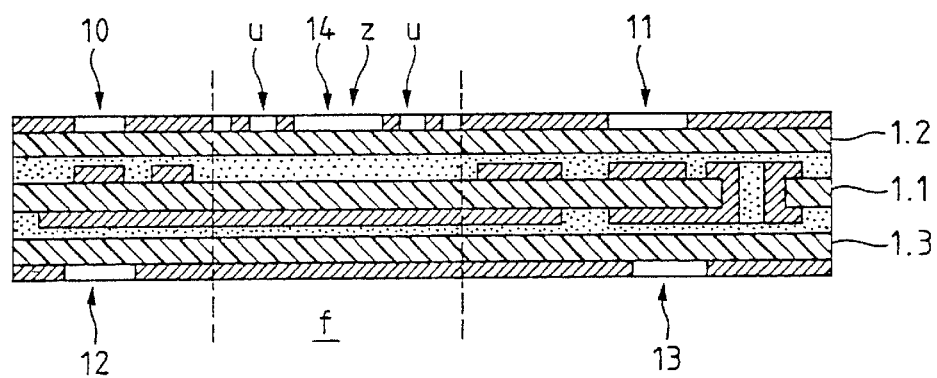
FIGS. 5a to 5d are sectional side elevational view of four stages in the production of a further embodiment of the foil circuit board according to the invention, the flexible area having reduced thickness insulating foil layers and the area transition is continuous.

FIG. 5a shows a foil circuit board with three insulating foil layers 1.1, 1.2, and 1.3. The metal coatings of the outer foil layers have already been etched away at points 10 to 13 for blind holes and at point 14 for the flexible area f. At point 14 there is an opening pattern, which has larger openings in the center z of the area and smaller openings towards its edge u.

Figure 5B:
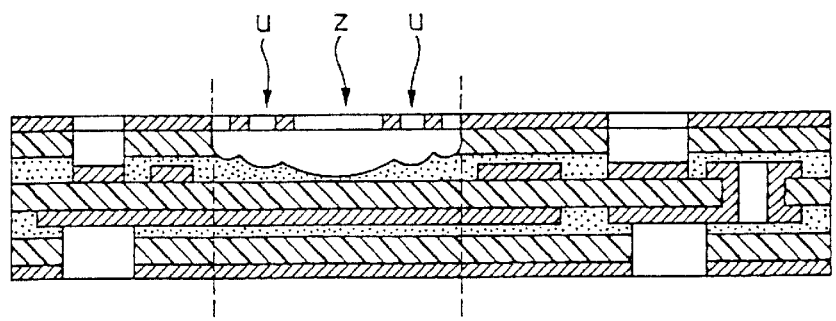

FIG. 5b shows the same circuit board after plasma etching. It is clear that the opening size determines the etching rate and consequently the etching rate is greater at the center z of the flexible area than at the edges or marginal areas u. This also permits the production of a flexible area with a continuous transition to the rigid area.

Figure 5C:
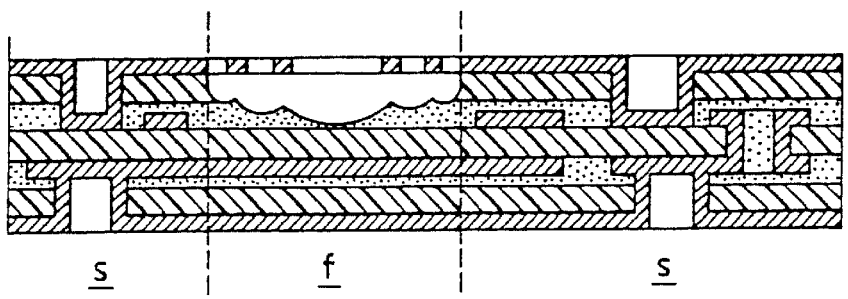
Figure 5D:
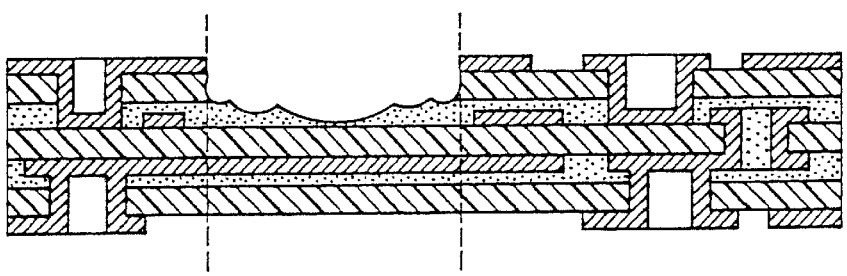

FIGS. 5c and 5d show the production of the circuit board by electroplating build-up of the metal coating and plating through the blind holes and by photochemical production of the outermost conductor pattern, the metal coating covering the flexible area f in sieve-like manner having been etched away.

It is obvious that in all the described cases the flexible area could also have been formed by weakening or complete removal of both outer foil layers. It is also obvious that flexible areas could be produced on foil circuit boards with more than three insulating foil layers, one or both of the outermost insulating foil layers being weakened or interrupted or additionally also the next inner insulating foil layer or layers.

In the same way the method according to the invention can be applied to foil circuit boards, whose outer layers have been produced by laminating on a metal coating with the aid of an adhesive film, such that the plastic coating is only in one-layer and not two-layer form between the corresponding conductor layers.

While the preferred embodiment of the present invention is shown and described herein, it is to be understood that the same is not so limited but shall cover and include any and all modifications thereof which fall within the purview of the invention.

What is claimed is:

1. A method for producing a foil circuit board, said foil circuit board including a plurality of flexible electrically non-conductive and flexible electrically conductive layers, said plurality of electrically non-conductive and electrically conductive layers being laminated together to form said foil circuit board, said non-conductive layers being positioned between said conductive layers and two of said flexible conductive layers being outermost surface layers, said board including flexible areas and rigid areas, said method comprising a step of etching said board to remove at least part of one of said outermost surface layers and an adjacent, underlying non-conductive layer.

2. The method according to claim 1, wherein an adhesive coating (3.1) is applied between at least one of said outermost surface layers (1.2) and at least one of said adjacent, underlying non-conductive layers, and during said etching step, said at least one of said adjacent, underlying non-conductive layers is at least partially removed from said flexible areas (f).

3. The method according to claim 1, wherein the flexible areas and contacting holes, which extend through at least one of the outermost surface layers are simultaneously formed in said etching steep.

* * * * *